United States Patent
Ishii et al.

(10) Patent No.: US 9,124,470 B2
(45) Date of Patent: Sep. 1, 2015

(54) RECEPTION SIGNAL PROCESSING DEVICE AND METHOD FOR PROCESSING RECEPTION SIGNAL

(71) Applicants: Hiroyuki Ishii, Tokyo (JP); Shohei Ikeda, Tokyo (JP)

(72) Inventors: Hiroyuki Ishii, Tokyo (JP); Shohei Ikeda, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/372,505

(22) PCT Filed: Feb. 13, 2013

(86) PCT No.: PCT/JP2013/000755
§ 371 (c)(1),
(2) Date: Jul. 16, 2014

(87) PCT Pub. No.: WO2013/125174
PCT Pub. Date: Aug. 29, 2013

(65) Prior Publication Data
US 2014/0348219 A1    Nov. 27, 2014

(30) Foreign Application Priority Data

Feb. 20, 2012   (JP) ................... 2012-033999

(51) Int. Cl.
| H04L 27/02 | (2006.01) |
| H04L 25/08 | (2006.01) |
| G01S 13/28 | (2006.01) |
| G01S 7/285 | (2006.01) |
(Continued)

(52) U.S. Cl.
CPC ............... *H04L 25/08* (2013.01); *G01S 7/285* (2013.01); *G01S 13/28* (2013.01); *H04L 1/0002* (2013.01); *H04L 27/0002* (2013.01); *H04L 27/2649* (2013.01)

(58) Field of Classification Search
CPC ........................ H04L 27/0002; H04B 1/18
See application file for complete search history.

(56) References Cited

U.S. PATENT DOCUMENTS 4,739,186 A * 4/1988 Crookshanks ............... 307/106
5,574,747 A * 11/1996 Lomp ........................ 375/144
(Continued)

FOREIGN PATENT DOCUMENTS

| JP | H10-512113 A | 11/1998 |
| JP | H10512113 A  | 11/1998 |
(Continued)

OTHER PUBLICATIONS

Richard Baraniuk et al., "Compressive Radar Imaging," IEEE Radar Conference, Apr. 2007, Waltham, MA, pp. 128-133.
(Continued)

*Primary Examiner* — Jaison Joseph
(74) *Attorney, Agent, or Firm* — Sughrue Mion, PLLC (57) ABSTRACT

A reception signal demodulation device which converts a modulated reception signal into a digital signal and performs signal reconstruction includes a demodulator which demodulates the received signal, a matched filter which improves a signal-to-noise power ratio of the signal from the demodulator, a threshold value discriminator which determines a compression rate based on the signal from the matched filter, and a reconstruction circuit which compresses the signal from the matched filter, converts it into the digital signal, and performs signal reconstruction from the signal converted into the digital signal based on the compression rate.

10 Claims, 5 Drawing Sheets

(51) Int. Cl.
*H04L 27/00* (2006.01)
*H04L 1/00* (2006.01)
*H04L 27/26* (2006.01)

(56) References Cited

U.S. PATENT DOCUMENTS

| | | | |
|---|---|---|---|
| 2009/0290632 A1* | 11/2009 | Wegener | 375/240 |
| 2010/0001901 A1 | 1/2010 | Baraniuk et al. | |
| 2011/0225218 A1* | 9/2011 | Eldar et al. | 708/4 |
| 2011/0294453 A1* | 12/2011 | Mishali et al. | 455/293 |
| 2013/0342388 A1* | 12/2013 | Maeno et al. | 342/202 |

FOREIGN PATENT DOCUMENTS

| | | |
|---|---|---|
| JP | 2011-146814 A | 7/2011 |
| JP | 2011146814 A | 7/2011 |
| JP | 2011-193431 A | 9/2011 |
| JP | 2011193431 A | 9/2011 |
| WO | 2007/050680 A2 | 5/2007 |
| WO | 2007050680 A2 | 5/2007 |
| WO | WO 2007050593 A2 * | 5/2007 |
| WO | WO 2012140578 A1 * | 10/2012 |

OTHER PUBLICATIONS

International Search Report for PCT Application No. PCT/JP2013/000755, mailed on Mar. 19, 2013.

Japanese Office Action for JP Application No. 2014-500897 mailed on Jun. 23, 2015 with English Translation.

Richard Baraniuk et al., "Compressive Radar Imaging," IEEE Radar Conference, Apr. 2007, Waltham, MA, pp. 128-133. JPOA.

* cited by examiner

RECEPTION SIGNAL PROCESSING DEVICE AND METHOD FOR PROCESSING RECEPTION SIGNAL

This application is a National Stage Entry of PCT/JP2013/000755 filed on Feb. 13, 2013, which claims priority from Japanese Patent Application 2012-033999 filed on Feb. 20, 2012, the contents of all of which are incorporated herein by reference, in their entirety.

TECHNICAL FIELD

The present invention relates to a reception signal processing device and a method for processing a reception signal.

BACKGROUND ART

According to the sampling theorem, a bandwidth required when an original signal is reconstructed from a received signal is more than two times larger than a signal bandwidth. However, when a compressive sensing technology is used, it is not always necessary to satisfy the sampling theorem. Therefore, the original signal can be reconstructed.

Figure 5:
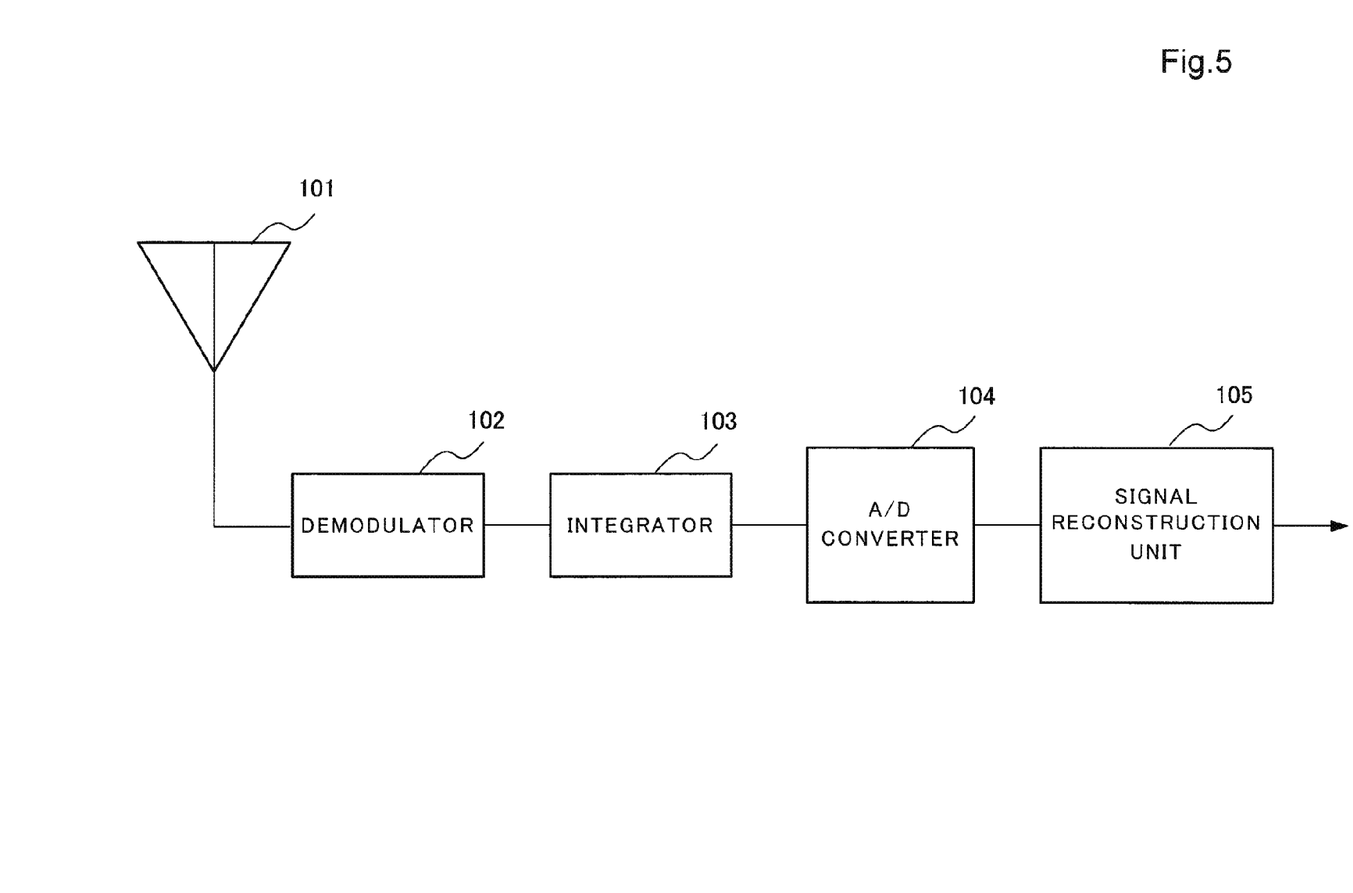
FIG. 5 is a block diagram of a radar device used for explaining the related technology.

For example, in non-patent document 1, a technology by which the signals reflected from a plurality of objects can be reconstructed under an undersampling condition in a radar device is disclosed. FIG. 5 is a block diagram of the radar device which reconstructs the signals under the undersampling condition by using the compressive sensing technology.

The radar device shown in FIG. 5 includes a reception antenna 101, a demodulator 102, an integrator 103, an A/D converter 104, and a signal reconstruction unit 105. A modulated signal is received from a space by the reception antenna 101 and outputted to the demodulator 102. The demodulator 102 demodulates the received signal and outputs this to the integrator 103 as a demodulated signal. The integrator 103 compresses the demodulated signal by performing integration with a time of a sampling interval required for the reconstruction intrinsically. Further, the signal to be compressed is requested to be a chirp signal or a PN signal which has a good RIP characteristic. Hereinafter, a degree of integration when the demodulated signal is compressed by performing the integration is defined as a compression rate. Accordingly, the integrator 103 performs a compression process at the compression rate set in advance. Further, the signal which has been compressed is described as a compressed signal.

Here, the RIP characteristic is an index indicating whether or not the signal can be reconstructed that is disclosed in non-patent document 1 and is determined by a configuration for compressing the signal (in this case, the integrator 103) and the signal to be compressed (in this case, the demodulated signal).

The compressed signal from the integrator 103 is inputted to the A/D converter 104. When the integrator 103 outputs the compressed signal obtained by performing the integration with for example, four sampling intervals to the A/D converter 104, the sampling rate that is one-fourth of the intrinsically required sampling rate can be used in the A/D converter 104. Accordingly, the A/D converter 104 converts the compressed signal into the digital signal at this sampling rate and outputs the digital signal to the signal reconstruction unit 105.

In the signal reconstruction unit 105, by solving the "L1 norm minimization problem" described in non-patent document 1, the desired signal is reconstructed from the output value of the A/D converter 104. At this time, when a condition in which an amount of information of the desired signal is sufficiently small compared to the signal bandwidth and information is not lost when the signal is compressed is met, a correct reconstruction result can be obtained. For example, in the radar device, when the number of objects is sufficiently small in an observation range, such conditions can be met.

PRIOR ART DOCUMENT

R. Baraniuk "Compressive Radar Imaging", IEEE Radar Conference, 2007

DISCLOSURE OF THE INVENTION

Problems to be Solved by the Invention

However, in the radar device using the compressive sensing technology shown in FIG. 5, as described later, when a signal-to-noise power ratio (SNR) at the demodulator 102 is small, a problem in which there is a case in which the signal cannot be correctly reconstructed and the process in the signal reconstruction unit 105 becomes redundant occurs.

Namely, in a state in which the SNR of the demodulated signal is small (it is equal to or less than 0 dB), there is a case in which a noise component is regarded as the object. In this case, because the condition at which the number of objects is sufficiently small compared to the inside of the observation range is not met, the signal cannot be reconstructed correctly.

Further, the smaller the number of objects is, the higher the value of the compression rate can be set. The higher the value of the compression rate is, the more the signal processing load on the signal reconstruction unit 105 can be reduced. However, to the contrary, when it is too high, there is a case in which the signal cannot be appropriately reconstructed.

In the radar device shown in FIG. 5, the signal reconstruction unit 105 does not know the number of objects in advance. For this reason, in order to perform the reconstruction for all the expected number of objects, the signal reconstruction unit 105 always performs the reconstruction process at the compression rate based on the maximum number of objects. However, because the number of objects is different for each observation actually, the signal processing load can be reduced by using the higher compression rate when the number of objects is sufficiently small compared to the maximum number of objects. In such case, the radar device shown in FIG. 5 performs a redundant process.

Accordingly, a main purpose of the present invention is to provide a reception signal processing device which can perform a signal reconstruction with high reliability even when the SNR of the demodulated signal is small and reduce the load on the signal reconstruction process at the time of the signal reconstruction and a method for processing the reception signal.

Means for Solving the Problems

In order to solve the above-mentioned problem, a reception signal demodulation device which converts a modulated reception signal into a digital signal and performs signal reconstruction includes a demodulator which demodulates the received signal, a matched filter which improves a signal-to-noise power ratio of the signal from the demodulator, a threshold value discriminator which determines a compression rate based on the signal from the matched filter, and a reconstruction circuit which compresses the signal from the matched filter, converts it into the digital signal, and performs signal reconstruction from the signal converted into the digital signal based on the compression rate.

A method for demodulating a reception signal by which a modulated reception signal is converted into a digital signal and signal reconstruction is performed includes a demodulation procedure for demodulating the received signal, a noise suppression procedure for improving a signal-to-noise power ratio of the signal from the demodulation procedure, a compression rate determination procedure for determining a compression rate based on the signal from the noise suppression procedure, and a reconstruction procedure for compressing the signal from the noise suppression procedure, converting it into the digital signal, and performing signal reconstruction from the signal converted into the digital signal based on the compression rate.

Effect of the Invention

By using the present invention, because the compression rate is determined from the signal whose signal-to-noise power ratio (SNR) is improved and the compression according to the compression rate, the A/D conversion, and the signal reconstruction are performed, the signal reconstruction can be performed with high reliability even when the SNR of the demodulated signal is small and the load on the signal reconstruction process can be reduced at the time of the signal reconstruction.

MOST PREFERRED MODE FOR CARRYING OUT THE INVENTION

<First Exemplary Embodiment>

Figure 1:
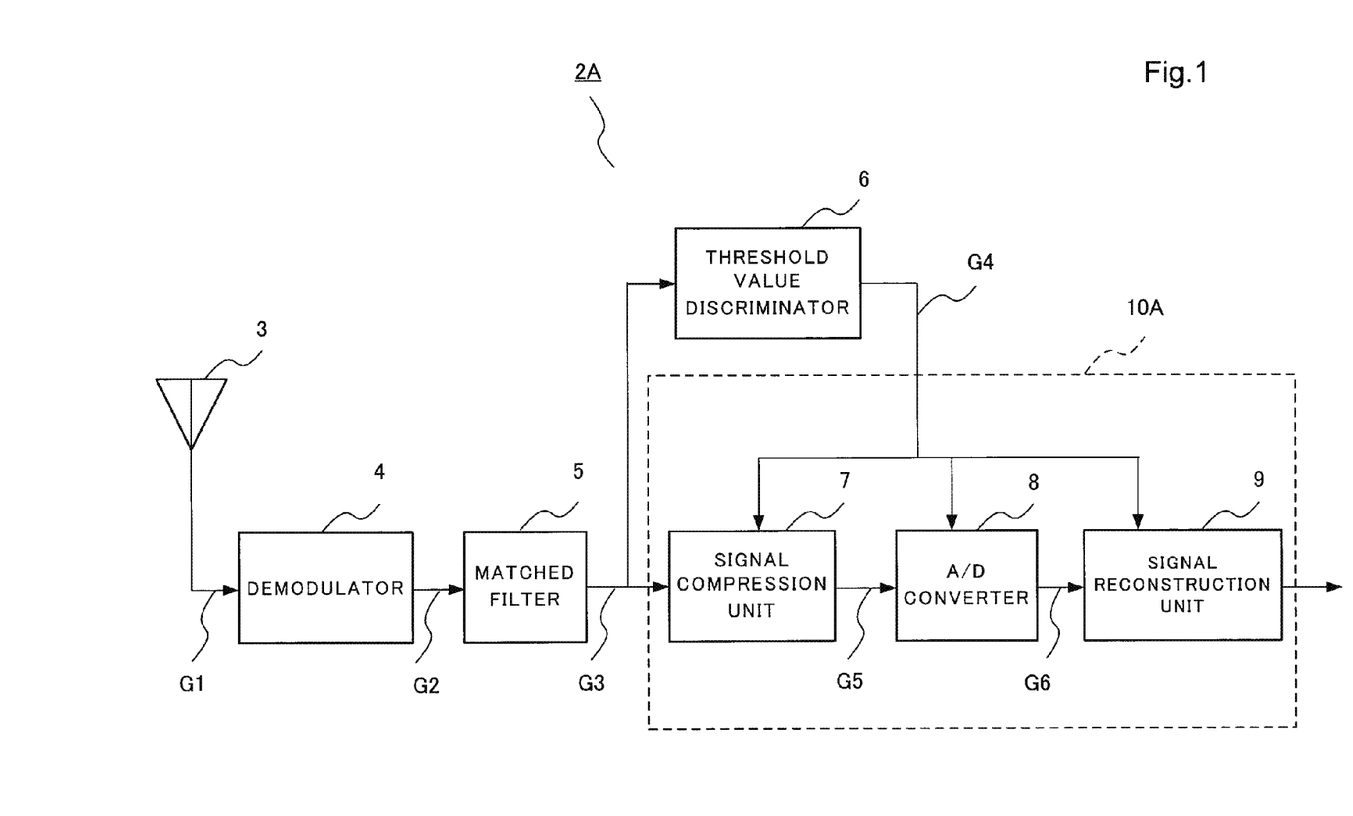
FIG. 1 is a block diagram of a reception signal processing device according to a first exemplary embodiment of the present invention.

Next, a first exemplary embodiment of the present invention will be described. FIG. 1 is a block diagram of a reception signal processing device 2A according to the first exemplary embodiment of the present invention. Such reception signal processing device can be utilized for an object detection in a radar device, a sonar device, or the like and also, utilized for reconstruction of the received signal in a communication system.

Such reception signal processing device 2A includes a reception antenna 3, a demodulator 4, a matched filter 5, a threshold value discriminator 6, and a reconstruction circuit 10A. Further, the reconstruction circuit 10A includes a signal compression unit 7, an A/D converter 8, and a signal reconstruction unit 9.

The reception antenna 3 is an antenna which receives a signal. The demodulator 4 demodulates a received signal G1 and outputs it as a demodulated signal G2. The matched filter 5 improves a signal-to-noise power ratio (SNR) of the demodulated signal and outputs it as a small noise demodulated signal G3.

The threshold value discriminator 6 counts the number of times at which the amplitude value of the small noise demodulated signal G3 exceeds a threshold value set in advance and estimates the number of objects to be detected by the radar device based on this count value. Hereinafter, the estimated number of objects is described as "estimated object number". The threshold value discriminator 6 calculates a compression rate based on an estimated object value and outputs a compression rate signal G4.

The signal compression unit 7 performs weighting to the small noise demodulated signal G3 from the matched filter 5 with a sampling interval that is intrinsically required for the reconstruction and outputs a cumulative sum as a compressed signal G5. The A/D converter 8 converts the compressed signal G5 into a digital signal G6. The signal reconstruction unit 9 performs a signal reconstruction from the digital signal G6.

Figure 2:
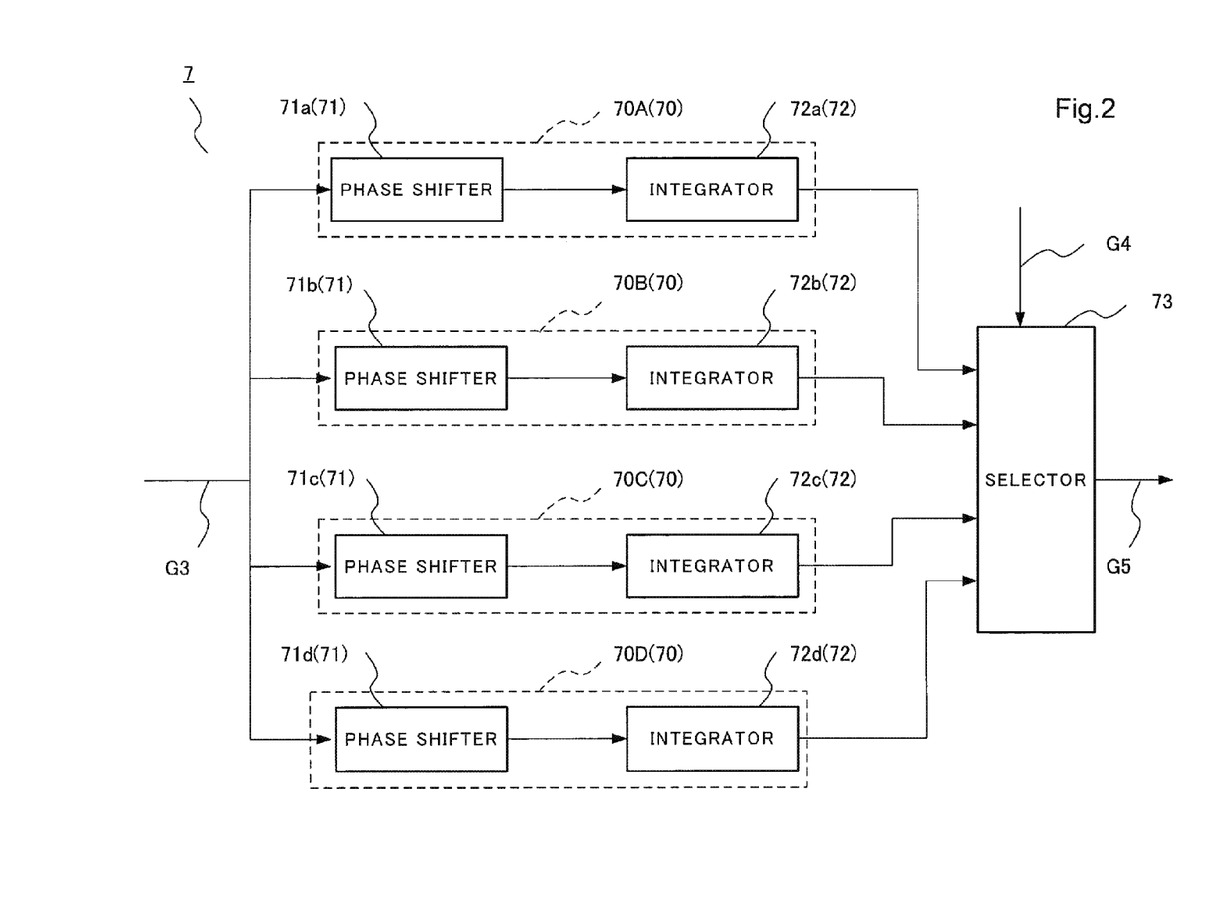
FIG. 2 is a block diagram of a signal compression unit in a reception signal processing device.

FIG. 2 is a block diagram of the signal compression unit 7. The signal compression unit 7 includes weighting units 70 (70A to 70D) which include phase shifters 71 (71a to 71d) and integrators 72 (72a to 72d), respectively and a selector 73. Further, in the exemplary embodiment, although the signal compression unit 7 includes four weighting units, this is shown as an example. Therefore, the number of the weighting units can be arbitrary determined.

The phase shifter 71 shifts the phase of the inputted demodulated signal by "0" or "π" radians at random with a sampling interval that is intrinsically required for the reconstruction to perform weighting. The integrator 72 outputs the cumulative sum of the signals that are weighted by the phase shifter 71. Further, this integrator 72 has a buffer function to store the value of the cumulative sum until the value is read from the selector 73. The selector 73 selects one of the outputs from the weighting units 70 in synchronization with the sampling timing of the A/D converter 8.

Figure 3:
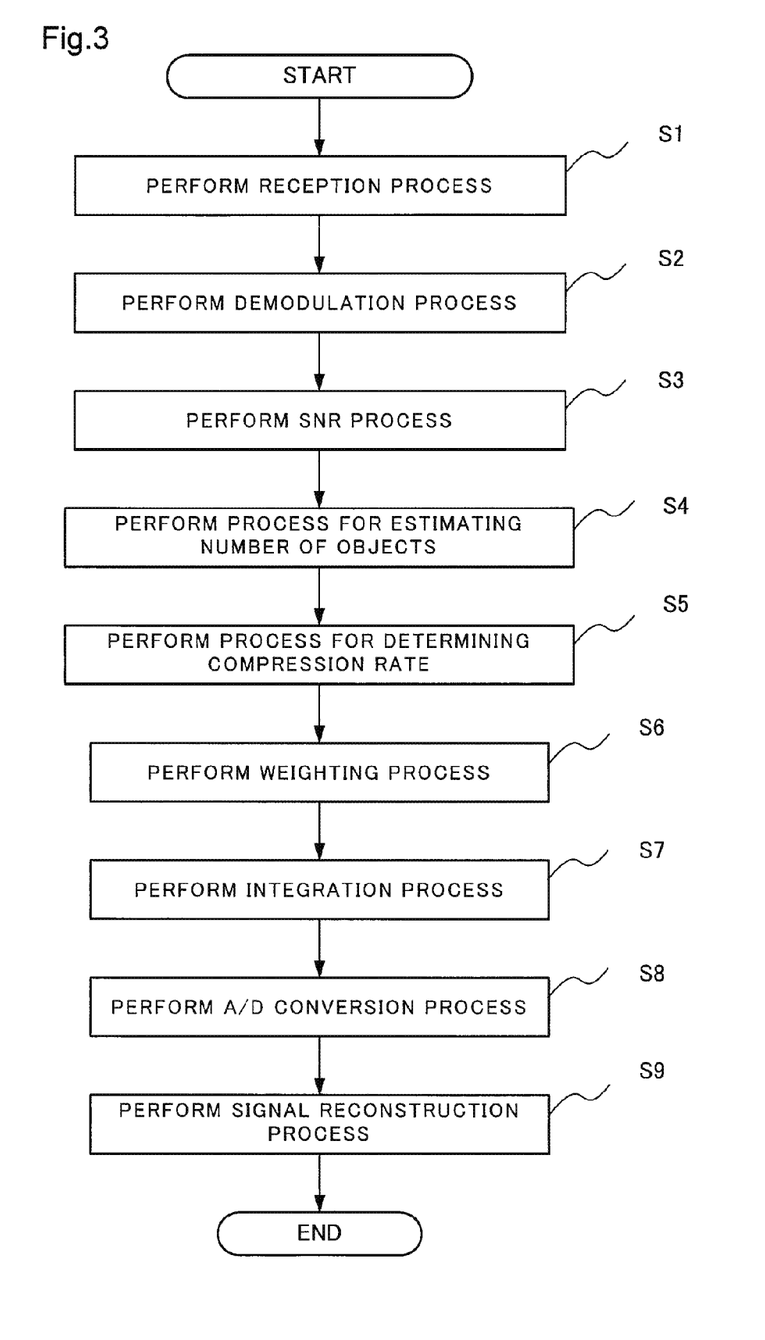
FIG. 3 is a figure showing a processing procedure of a reception signal processing device.

Next, the operation of the reception signal processing device having such configuration will be described. FIG. 3 is a flowchart showing a method for processing a reception signal.

Steps S1 and S2: The reception antenna 3 receives the signal and outputs this as the received signal G1. The received signal G1 includes not only a reflected signal from the object but also a signal reflected by another body or the like existing in a periphery as a noise. The received signal G1 including such noise is inputted to the demodulator 4 and demodulated.

Step S3: The demodulated signal G2 from the demodulator 4 is inputted to the matched filter 5 and the autocorrelation between the demodulated signal and the transmission waveform is obtained. Whereby, the SNR of the demodulated signal is improved. The demodulated signal whose SNR is improved is outputted to the threshold value discriminator 6 and the signal compression unit 7 as the small noise demodulated signal G3.

Step S3: The threshold value discriminator 6 counts the number of the times at which the amplitude value of the small noise demodulated signal G3 is greater than the threshold value set in advance. The small noise demodulated signal G3 is a signal obtained by improving the SNR of the demodulated signal G2. For this reason, because the noise included in the small noise demodulated signal G3 is small, the main component of the signal is the signal reflected by the object. Because it is expected that the signal component reflected by the object has a large amplitude, the number of objects can be estimated by setting the threshold value and counting the number of times at which the amplitude exceeds this threshold value. Of course, because the noise cannot be removed completely, in a strict sense, the counted number does not correspond to the number of objects. For example, the counted number counted by the threshold value discriminator 6 can be used as the estimated object number.

Steps S4 and S5: The threshold value discriminator 6 converts the estimated object number into the compression rate, and outputs it to the signal compression unit 7, the A/D converter 8 and the signal reconstruction unit 9 as the compression rate signal G4. Further, when the estimated object number is converted into the compression rate, the function transformation can be used. However, for example, a conversion table between the estimated object number and the compression rate or the like is provided in advance and the compression rate may be obtained based on the conversion table.

Steps S6 and S7: In the signal compression unit 7, the phase shifter 71 performs a weighting process in which a weighting factor of "1" or "−1" is used for the small noise demodulated signal G3 from the matched filter 5 at random and the integrator 72 performs an integration process by which the weighted signals are integrated to generate the compressed signal G5. The signal compression unit 7 performs the integration according to the compression rate signal G4 and outputs it to the A/D converter 8 as the compressed signal G5.

In the weighting process, the weighting is performed by shifting the phase by "0" or "π" radians at random with a sampling interval that is intrinsically required for a phase shift amount. In this case, the phase shift by "0" radian corresponds to the weighting using the weighting factor of "1" and the phase shift by "π" radians corresponds to the weighting using the weighting factor of "−1".

The integration process performs an integration of a weighted signal G7 with a sampling interval that is intrinsically required. The phase shifter 71 of each weighting unit 70 performs the weighting process.

For example, it is assumed that "T" is the sampling interval that is intrinsically required to correctly reconstruct a signal before compression and the time width of the small noise demodulated signal G3 is "8T". Further, it is assumed that the compression rate signal G4 from the threshold value discriminator 6 is "2". In this case, because the compression rate is "2", the sampling interval of the A/D converter 8 is "2T" and the sampling rate is "½T". Therefore, the sampling rate is a half of the sampling rate that is intrinsically required. Four signals that correspond to the first to fourth sampling values are outputted from the integrators 72, respectively.

Namely, the signal that is obtained by weighting the signal part from 0 to 2T of the small noise demodulated signal G3 having the entire time width of 8T with the interval T is outputted from the integrator 72a as the first sampling value. The signal that is obtained by weighting the signal part from 0 to 4T of the small noise demodulated signal G3 with the interval T is outputted from the integrator 72b as the second sampling value. The signal that is obtained by weighting the signal part from 0 to 6T of the small noise demodulated signal G3 with the interval T is outputted from the integrator 72c as the third sampling value. Further, the signal that is obtained by weighting the signal part from 0 to 8T of the small noise demodulated signal G3 with the interval T is outputted from the integrator 72d as the fourth sampling value.

The selector 73 changes a connection destination for each sampling time of the A/D converter 8 so as to input the signal from each weighting unit 70 to the A/D converter 8 as the compressed signal G5. The sampling timing is set based on the compression rate signal.

Step S8: The A/D converter 8 converts the compressed signal G5 into the digital signal at the sampling rate corresponding to the compression rate signal G4 from the threshold value discriminator 6 and outputs it to the signal reconstruction unit 9.

Step S9: The signal reconstruction unit 9 calculates the output signal from the matched filter 5 that is converted in a digital form from the output value of the A/D converter 8 by solving the "L1 norm minimization problem".

As described above, even when the SNR of the received signal is small, the SNR is improved by the matched filter. Therefore, the highly accurate signal demodulation can be performed. Further, because the number of objects is estimated from the small noise demodulated signal whose SNR is improved and the compression rate is determined based on the estimated object number, the load on the signal reconstruction process can be reduced.

<Second Exemplary Embodiment>

Next, a second exemplary embodiment of the present invention will be described. Further, the same reference numbers are used for the elements having the same function as the first exemplary embodiment and the description of the element will be omitted appropriately.

In the first exemplary embodiment, the compression rate determined by the threshold value discriminator 6 is inputted to the signal compression unit 7, the A/D converter 8, and the signal reconstruction unit 9 and these elements operate according to the compression rate. The value of the compression rate changes according to the number of objects. Accordingly, the processes of the signal compression unit 7, the A/D converter 8, and the signal reconstruction unit 9 change according to the number of objects. In this case, if a configuration in which the processes of the signal compression unit 7 and the A/D converter 8 are changed according to the number of objects is used, these processes have to be performed as an adaptive process and there is a possibility that the configuration becomes complex.

Figure 4:
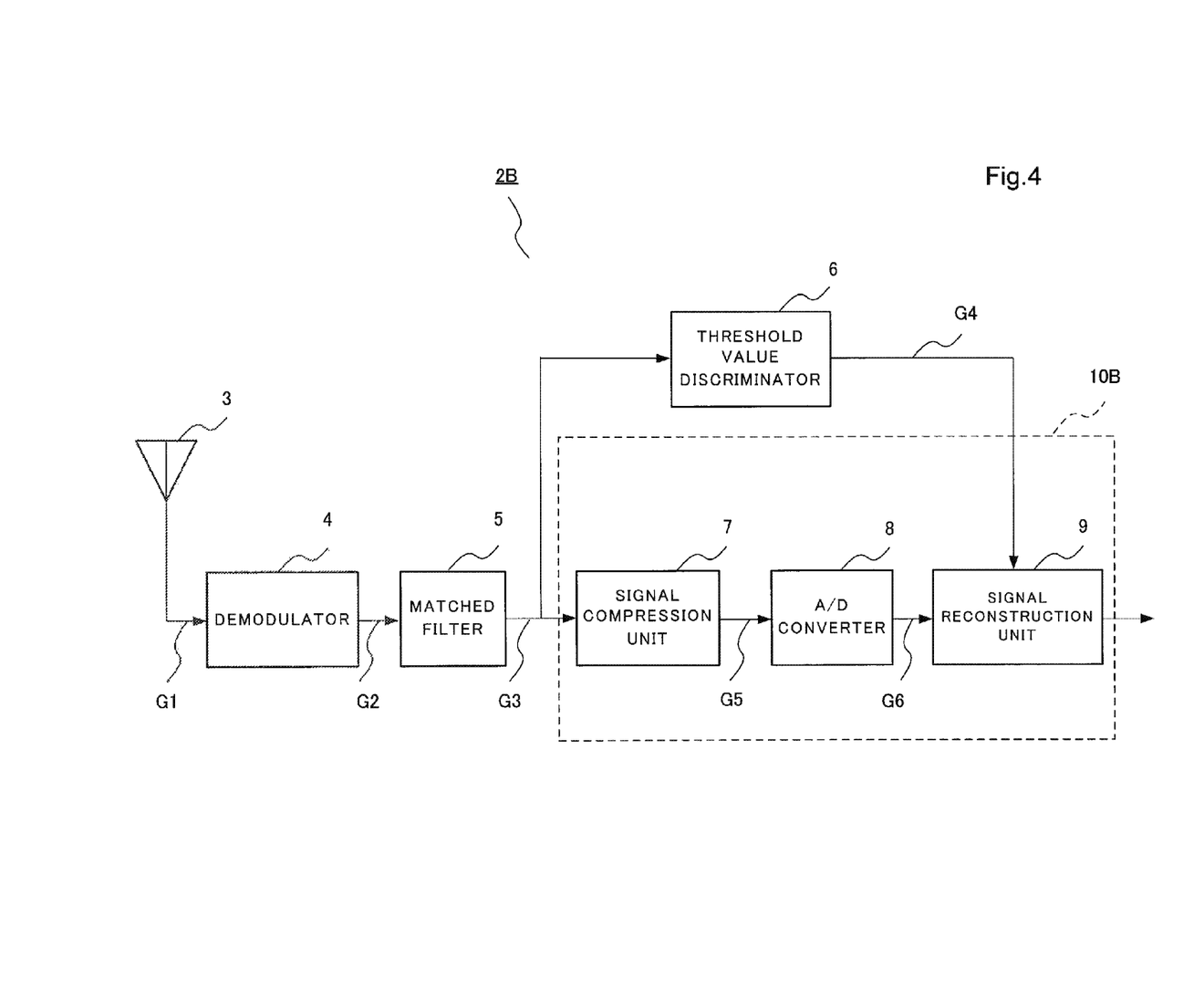
FIG. 4 is a block diagram of a reception signal processing device according to a second exemplary embodiment of the present invention.

Accordingly, in this exemplary embodiment, the signal compression unit 7 and the A/D converter 8 perform the process by using a fixed compression rate corresponding to the maximum number of objects that is set in advance and the signal reconstruction unit 9 performs the reconstruction process by using the compression rate determined by the threshold value discriminator 9.

FIG. 4 is a block diagram of a reception signal processing device 2B that has such configuration. The reception signal processing device 2B includes the reception antenna 3, the demodulator 4, the matched filter 5, the threshold value discriminator 6, and a reconstruction circuit 10B like the reception signal processing device 2A shown in FIG. 1. Further, the reconstruction circuit 10B includes the signal compression unit 7, the A/D converter 8, and the signal reconstruction unit 9.

However, the compression rate signal G4 from the threshold value discriminator 6 is inputted to only the signal reconstruction unit 9. The compression rate corresponding to the maximum number of objects set in advance is set to the signal compression unit 7 and the A/D converter 8 as the fixed value (the fixed compression rate). When such setting is used, the processing timing of the signal compression unit 7 and the A/D converter 8 is different from that of the signal reconstruction unit 9. As a result, the thinning of the sampled digital signal occurs in the signal reconstruction unit 9 and the load on the process in the signal reconstruction unit 9 is reduced.

Accordingly, even when the SNR of the received signal is small, the SNR is improved by the matched filter. Therefore, the highly accurate signal demodulation can be performed. Further, the number of objects is estimated from the small noise demodulated signal whose SNR is improved and the compression rate is determined based on the estimated object number. Whereby the load on the signal reconstruction process can be reduced by the thinning of the sampled digital signal.

This application claims priority based on Japanese Patent Application No. 2012-033999, filed on Feb. 20, 2012, the disclosure of which is hereby incorporated by reference in its entirety.

DESCRIPTION OF SYMBOL 2 reception signal processing device
3 reception antenna
4 demodulator
5 matched filter
6 threshold value discriminator
7 signal compression unit
9 signal reconstruction unit
70 (70A to 70D) weighting unit
71 (71a to 71d) phase shifter
72 (72a to 72d) integrator
73 selector

What is claimed is:

1. A reception signal demodulation device which converts a modulated reception signal into a digital signal and performs signal reconstruction, comprising:
a demodulator which demodulates the received signal;
a matched filter which improves a signal-to-noise power ratio of the signal from the demodulator;
a threshold value discriminator which determines a compression rate based on the signal from the matched filter; and
a reconstruction circuit which compresses the signal from the matched filter, converts it into the digital signal, and performs signal reconstruction from the signal converted into the digital signal based on the compression rate.

2. The reception signal demodulation device according to claim 1, wherein
the reconstruction circuit comprises:
a signal compression unit which compresses the signal from the matched filter based on the compression rate;
an A/D converter which converts the signal from the signal compression unit into the digital signal based on the compression rate; and
a signal reconstruction unit which performs signal reconstruction from the signal from the A/D converter based on the compression rate.

3. The reception signal demodulation device according to claim 1, wherein
the reconstruction circuit comprises:
a signal compression unit which compresses the signal from the matched filter based on a fixed compression rate corresponding to the maximum number of objects that is set in advance;
an A/D converter which converts the signal from the signal compression unit into the digital signal based on the fixed compression rate; and
a signal reconstruction unit which performs signal reconstruction from the signal from the A/D converter based on the compression rate.

4. The reception signal processing device according to claim 1, wherein
the threshold value discriminator counts the number of times at which the amplitude of the signal from the matched filter exceeds a threshold value set in advance, estimates the number of objects based on the count value, and determines the compression rate.

5. The reception signal processing device according to claim 1, wherein
the signal compression unit comprises:
a plurality of weighting units each of which includes a phase shifter which performs weighting using a weighting factor of "1" or "−1" to the output signal from the matched filter based on the compression rate by shifting a phase by "0" or "π" radians at random with a sampling interval that is intrinsically required and an integrator which integrates the signal from the phase shifter; and
a selection unit which sequentially reads out the signals from the respective weighting units based on the compression rate.

6. A method for demodulating a reception signal by which a modulated reception signal is converted into a digital signal and signal reconstruction is performed, comprising:
a demodulation procedure for demodulating the received signal;
a noise suppression procedure for improving a signal-to-noise power ratio of the signal acquired by the demodulation procedure;
a compression rate determination procedure for determining a compression rate based on the signal acquired by the noise suppression procedure; and
a reconstruction procedure for compressing the signal acquired by the noise suppression procedure, converting it into the digital signal, and performing signal reconstruction from the signal converted into the digital signal based on the compression rate.

7. The method for demodulating a reception signal according to claim 6, wherein the reconstruction procedure comprises:
a signal compression procedure for compressing the signal acquired by the noise suppression procedure based on the compression rate;
an A/D conversion procedure for converting the signal acquired by the signal compression procedure into the digital signal based on the compression rate; and
a signal reconstruction procedure for performing signal reconstruction from the signal acquired by the A/D conversion procedure based on the compression rate.

8. The method for demodulating a reception signal according to claim 6, wherein the reconstruction procedure comprises:
a signal compression procedure for compressing the signal acquired by the noise suppression procedure based on a fixed compression rate corresponding to the maximum number of objects that is set in advance;
an A/D conversion procedure for converting the signal acquired by the signal compression procedure into the digital signal based on the fixed compression rate; and
a signal reconstruction procedure for performing signal reconstruction from the signal acquired by the A/D conversion procedure based on the compression rate.

9. The method for processing a reception signal according to claim 6, wherein
the compression rate determination procedure counts the number of times at which an amplitude of the signal acquired by the noise suppression procedure exceeds a threshold value set in advance, estimates the number of objects based on the count value, and determines the compression rate.

10. The method for processing a reception signal according to claim 6, wherein
the signal compression procedure comprises:
a procedure for performing weighting using a weighting factor of "1" or "−1" to the output signal acquired by the noise suppression procedure based on the compression rate by shifting a phase by "0" or "π" radians at random with a sampling interval that is intrinsically required and performing an integration; and
a procedure for sequentially reading out the weighted and integrated signal based on the compression rate.

* * * * *